United States Patent [19]

Chai et al.

[11] Patent Number: 5,229,329

[45] Date of Patent: Jul. 20, 1993

[54] METHOD OF MANUFACTURING INSULATED LEAD FRAME FOR INTEGRATED CIRCUITS

[75] Inventors: Tai C. Chai; Boon Q. Seow; Karta W. Tjandra; Thiam B. Lim; Tadashi Saitoh, all of Singapore, Singapore

[73] Assignee: Texas Instruments, Incorporated, Dallas, Tex.

[21] Appl. No.: 933,863

[22] Filed: Aug. 21, 1992

Related U.S. Application Data

[63] Continuation of Ser. No. 662,082, Feb. 28, 1991, abandoned.

[51] Int. Cl.⁵ ............................................. H01L 21/60
[52] U.S. Cl. ................................... 437/217; 437/219; 437/220; 437/246
[58] Field of Search ............... 437/218, 215, 209, 211, 437/210, 217, 220; 357/70

[56] References Cited

U.S. PATENT DOCUMENTS

| 3,673,309 | 6/1972 | Dalmasso et al. | 437/220 |
| 3,978,578 | 9/1976 | Murphy | 437/220 |
| 4,721,994 | 1/1988 | Mine et al. | 357/70 |
| 4,862,245 | 8/1989 | Pashby et al. | |
| 4,916,519 | 4/1990 | Ward | 357/70 |
| 4,965,654 | 10/1990 | Karner et al. | 357/70 |

FOREIGN PATENT DOCUMENTS

| 0076868 | 5/1982 | Japan | 437/211 |
| 0079628 | 5/1982 | Japan | 437/209 |
| 0028841 | 2/1983 | Japan | 437/211 |
| 0086232 | 5/1984 | Japan | 437/211 |
| 62-235763 | 10/1987 | Japan | |
| 0166759 | 6/1990 | Japan | 357/70 |
| 0203542 | 8/1990 | Japan | 437/211 |

*Primary Examiner*—Brian E. Hearn
*Assistant Examiner*—Michael Trinh
*Attorney, Agent, or Firm*—Lawrence J. Bassuk; Robby T. Holland; Rose K. Castro

[57] ABSTRACT

An insulated lead frame for a semiconductor packaged device and a method of manufacturing both the insulated lead frame and the semiconductor packaged device are disclosed. The insulated lead frame has a first plurality of lead fingers and a second plurality of lead fingers. It also has the face of a power supply bus lying between the pluralities of lead fingers. An insulator covers the face of the power supply bus. An example of an insulator is a cured liquid polyimide. In a semiconductor packaged device using a lead on chip lead frame, such as a dynamic random access memory, DRAM, wire bonding that connects the power supply busses of the lead frame may first occur and the liquid insulator may afterwards be applied to the power supply busses. Alternatively, by knowing where the wire bonds will bond to the power supply busses, the liquid insulator may be applied to the power supply busses before wire bonding occurs. The bonding spots on the power supply busses are not covered with the liquid insulator. Both methods serve to reduce the possibility of shorting between the power supply busses and the crossing wire bonds that connect the lead fingers of the lead frame to the bonding pads of the integrated circuit.

4 Claims, 7 Drawing Sheets

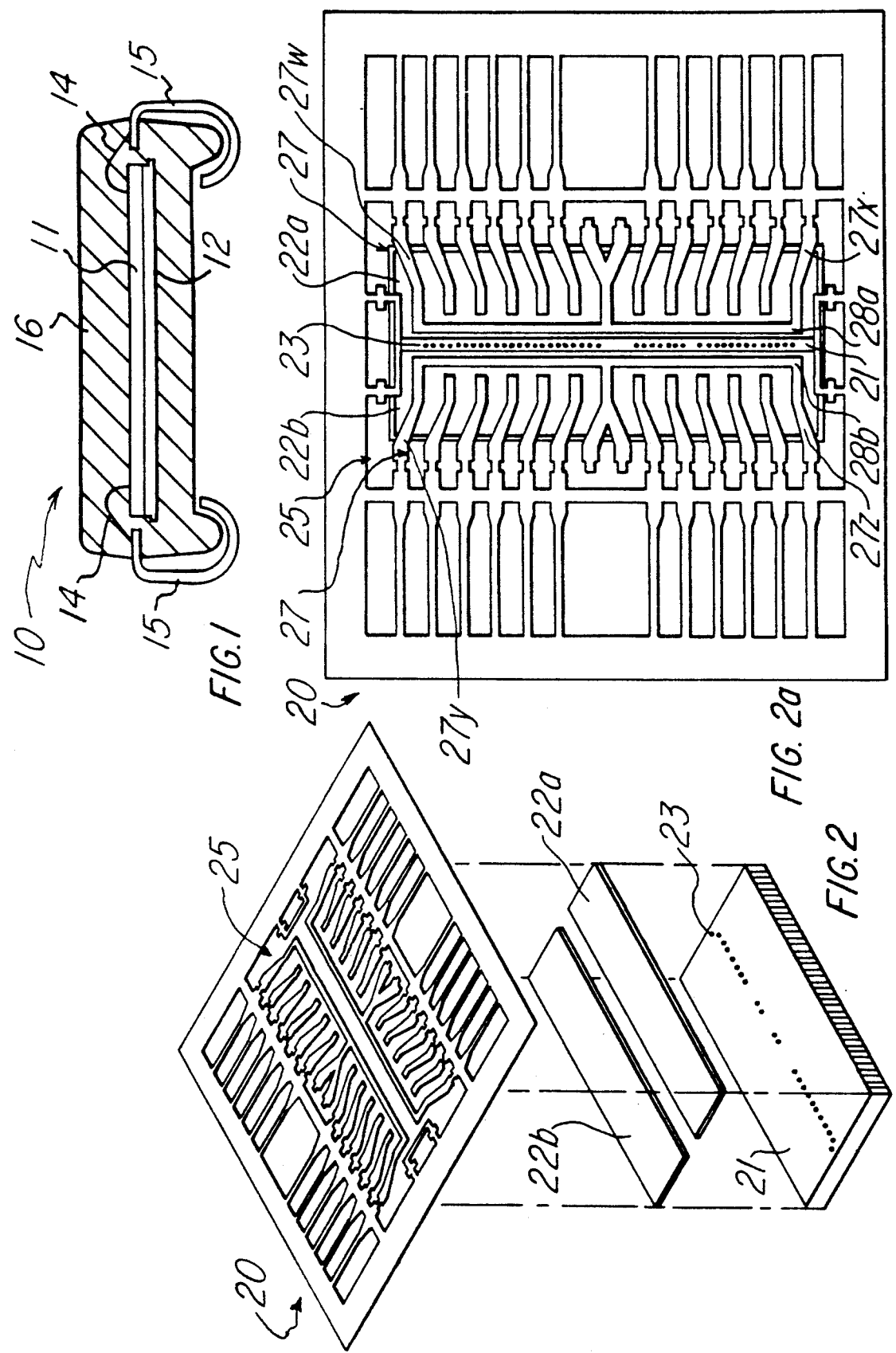

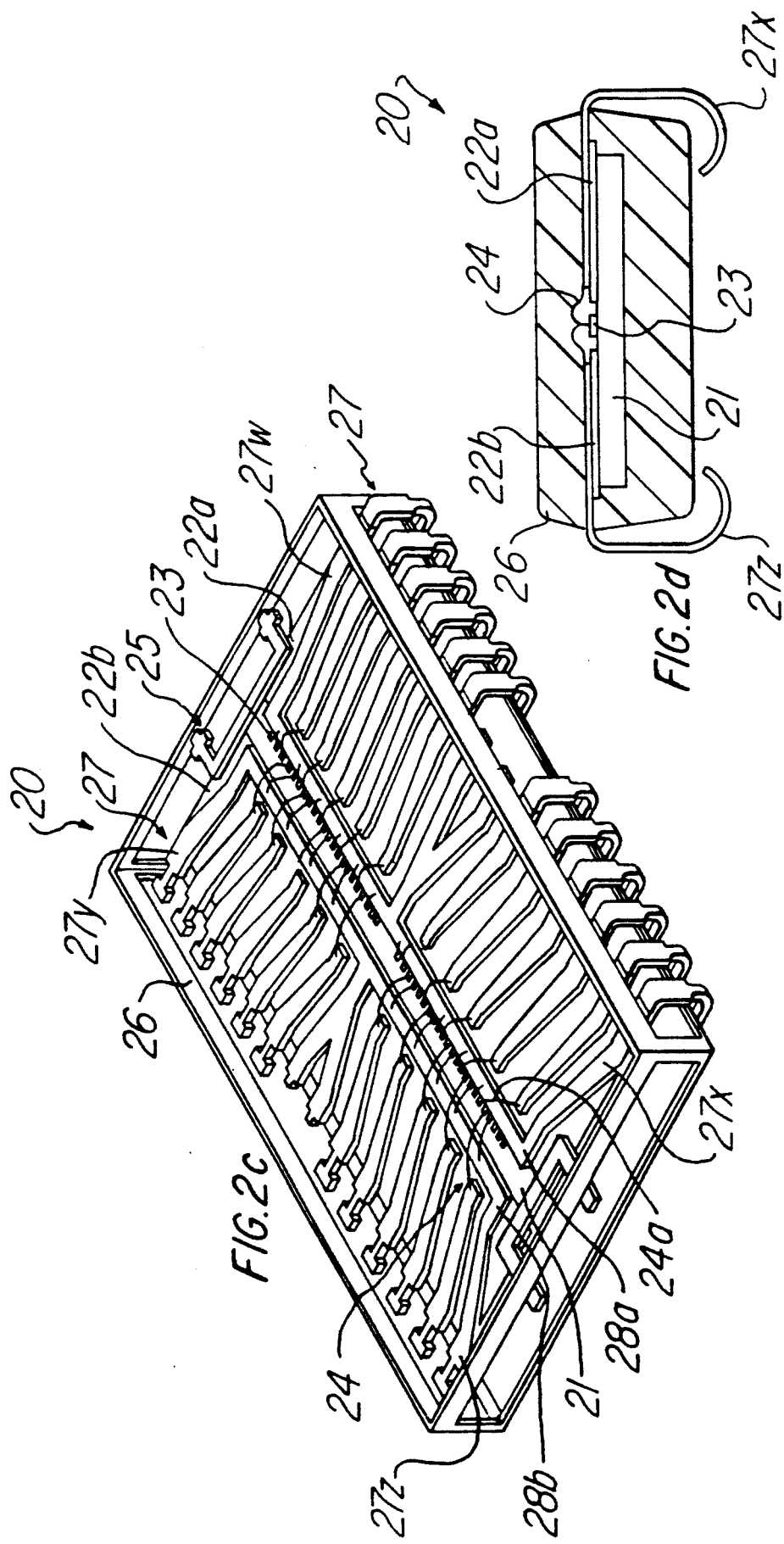

METHOD OF MANUFACTURING INSULATED LEAD FRAME FOR INTEGRATED CIRCUITS

This application is a continuation of application Ser. No. 07/662,082, filed Feb. 28, 1991, now abandoned.

FIELD OF THE INVENTION

This invention relates to integrated circuits, and more particularly relates to integrated circuit packages.

BACKGROUND OF THE INVENTION

An integrated circuit packaged device generally includes an integrated circuit chip lying on a chip support pad. Wire bonds connect the IC to a lead frame. A substance, such as plastic, encapsulates the structure. The plastic small outline J lead (PSOJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead on chip package, (LOC). As described in U.S. Pat. No. 4,862,245 to Pashby et al., issued Aug. 29, 1989, and in U.S. Pat. No. 4,916,519 to Ward, issued Apr. 10, 1990, and in the article entitled *Volume Production of Unique Plastic Surface Mount Modules For The IBM 80-ns 1-Mbit DRAM Chip by Area Wire Bond Techniques* by William C. Ward, published at the 38th ECC in IEEE 1988, pages 552-557, this technique disposes a lead frame over the active area of an integrated circuit. Adhesive insulating tape attaches the lead frame to the integrated circuit chip. Wire bonds connect the circuit to the centrally disposed power supply busses. And, wire bonds jump over the power supply busses to connect the integrated circuit to conductive lead fingers. No chip support pad is required.

Concerns exist about potential wire bond shorting to the power bus portions of the lead frame in the LOC package. Since the wires to the signal pins cross the metal lead frame power bus, the opportunity for shorting may arise from assembly processes such as poor bond location, wire loop control, mold compound sweep, or from accidental touching during processing. These assembly process also create concerns about shorting between the wirebonds themselves.

One approach to minimize shorting problems suggests the use insulated wire. See, *Insulated Aluminum Bonding Wire For High Lead Count Packaging* by Alex J. Oto, International Journal For Hybrid Microelectronics, Vol. 9, No. 1, 1986. While insulated wire has been reported to have some degree of success in conventional assembly packages, the successful implementation in a LOC package is questionable due to the nature of the wire bond stitch as it occurs over the insulating film on top of the integrated circuit; the probability of successful implementation is therefore less likely. Additionally, insulated wire is expensive.

It is an object of this invention to provide a solution to wire bond shorting in lead on chip integrated circuit packaged devices.

Other objects and benefits of this invention will be apparent to those of ordinary skill in the art having the benefit of the description to follow herein.

SUMMARY OF THE INVENTION

An insulated lead frame for a semiconductor packaged device and a method of manufacturing both the insulated lead frame and the semiconductor packaged device are disclosed. The insulated lead frame has a first plurality of lead fingers and a second plurality of lead fingers. It also has the face of a power supply bus lying between the pluralities of lead fingers. An insulator covers the face of the power supply bus. An example of an insulator is a cured liquid polyimide. In a semiconductor packaged device using a lead on chip lead frame, such as a dynamic random access memory, DRAM, wire bonding that connects the power supply busses of the lead frame may first occur and the liquid insulator may afterwards be applied to the power supply busses. Alternatively, by knowing where the wire bonds will bond to the power supply busses, the liquid insulator may be applied to the power supply busses before wire bonding occurs. The bonding spots on the power supply busses are not covered with the liquid insulator. Both methods serve to reduce the possibility of shorting between the power supply busses and the crossing wire bonds that connect the lead fingers of the lead frame to the bonding pads of the integrated circuit.

BRIEF DESCRIPTION OF THE DRAWINGS

FIG. 1 is a cross section view of a typical integrated circuit package.

FIG. 2 is a perspective, exploded view of a lead on chip center bond device illustrating the lead frame, adhesive tape, and integrated circuit.

FIG. 2a is a top view of the lead on chip center bond device illustrating the connection of the integrated circuit chip thereunder.

FIG. 2c is a top view of the lead on chip center bond device wherein the encapsulating mold compound is rendered transparent.

FIG. 2d is a side view of the completed lead on chip center bond package.

FIG. 4a is an enlarged partial end view of FIG. 4.

DETAILED DESCRIPTION OF SPECIFIC EMBODIMENT

Figure 2B:
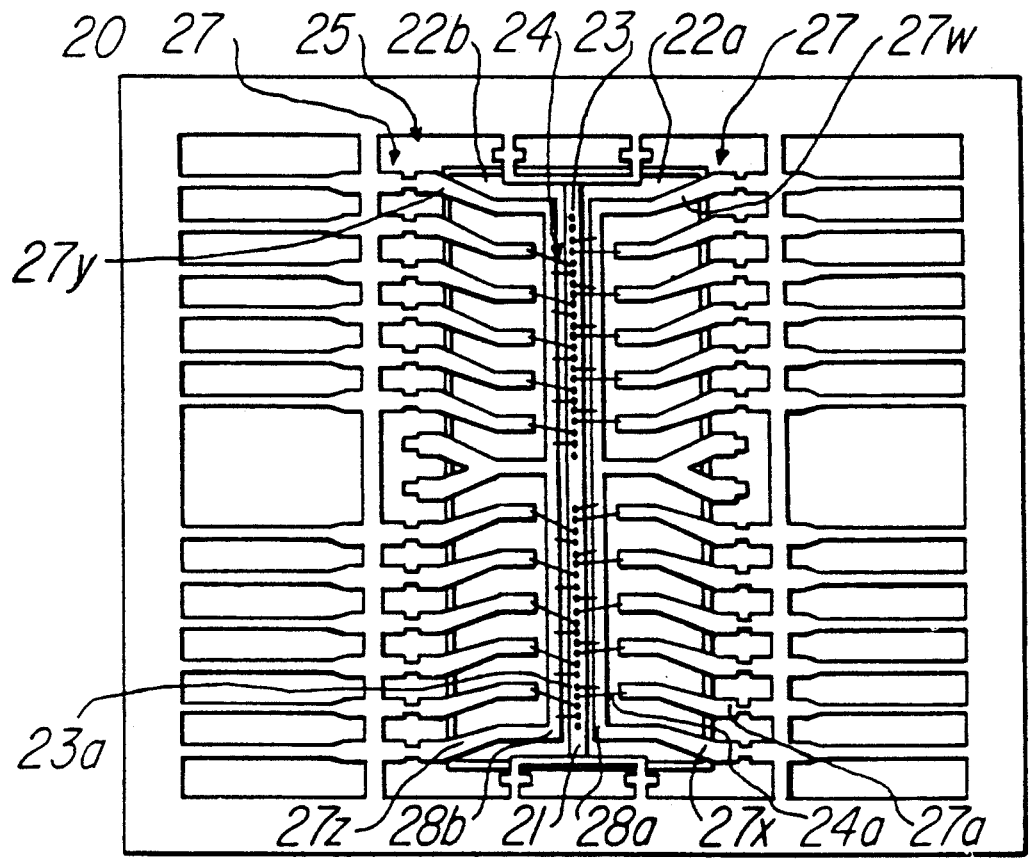
FIG. 2b is a top view of the lead on chip center bond device illustrating the connecting wire bonds.

FIG. 1 illustrates an integrated circuit packaged device 10 constructed in the industry standard plastic small outline J-leaded (PSOJ) surface mount package. A semiconductor integrated circuit chip 11 rests on a mount support pad (chip attach) 12. Wire bonds 14 connect the bonding pads (not shown) located along the outer edges of semiconductor circuit 11 to conductive "J" shaped lead fingers 15. A mold compound material 16 such as plastic encapsulates the components.

FIG. 2 illustrates an initial stage of the LOC concept. The following copending and coassigned applications also describe the LOC concept:

| Ser. No. | Inventor | Filed | TI-Docket |
| --- | --- | --- | --- |
| 373,742 | Heinen, et al. | 06/30/89 | 14287 |
| 455,210 | Lim, et al. | 12/22/89 | 14600 |
| 455,105 | Lim, et al. | 12/22/89 | 14603 |

In packaged device 20 of FIG. 2, the bond pads 23 lie along the central horizontal axis of semiconductor integrated circuit chip 21. Semiconductor 21 lies beneath lead on chip lead frame 25. Lead on chip lead frame 25 may be formed of conductive metal. An example is full hard temper CDA alloy 151 about 0.008 inches thick that may be spot plated in gold, silver, or the like. Another example is half hard alloy 42. Semiconductor chip 21 may be, for example, a 16 Megabit Dynamic Random Access Memory (DRAM) storing more than 16 million data bits on a semiconductor substrate about 325×660 mils. Two pieces of double sided adhesive tape 22a and 22b are disposed over the top active surface of semiconductor circuit 21 and attach lead frame 25 over the top of chip 21. It is this configuration that leads to the description "lead on chip", (LOC). The centrally disposed bond pads 23 lead to the further description "lead on chip center bond", (LOCCB). Double sided adhesive tape 22a and 22b may comprise, for example, a double sided thermosetting epoxy adhesive coated polyimide film that also acts as an active barrier. One such commercially available tape containing a polyimide film is sold under the trade name Dupont Kapton. The chip 21 and the lead frame 25 form a self supporting structure. No chip support pad is required.

FIG. 2a depicts the resulting structure when the lead frame 25 is affixed over the integrated circuit 21 in the manner shown in FIG. 2. The power busses 28a and 28b are part of the lead frame material and comprise spaced apart parallel conductive busses that run along the middle of the chip 21. Power supply bus 28a is connected between lead fingers 27w and 27x and may provide, for example, ground voltage Vss. Power supply bus 28b is connected between lead fingers 27y and 27z and may provide, for example, positive voltage Vdd. The adhesive tapes 22a and 22b are spaced apart such that the bond pads 23 of chip 21 are exposed for bonding to the conductive lead fingers 27 of lead frame 25.

FIG. 2b illustrates a subsequent assembly stage of packaged device 20 wherein high speed thermosonic gold ball wire bonding is accomplished to connect the bond pads 23 to various lead fingers 27 and to the power supply busses 28a and 28b. While various types of wire bonding may be utilized, gold wire bonds of about 0.001 inches diameter are sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal tip ends of the conductive lead fingers 27. Wire bond 24a is exemplary. One end of wire bond 24a is attached to the internal tip end of lead finger 27a. Wire bond 24a passes over power supply bus 28a where the other end of wire bond 24a is connected to bond pad 23a. An undesirable wire sweep could result in wire bond 24a touching power supply bus 28a thereby causing an undesirable short.

FIG. 2c illustrates packaged device 20 in a subsequent assembly stage with the plastic encapsulant 26 rendered transparent. Transfer molding is accomplished using a molding compound such as a Novolac epoxy. Low stress mold techniques work well in encapsulating the device. The plastic encapsulant 26 surrounds the integrated circuit 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. There are 24 lead fingers 27 extending through the plastic encapsulant.

FIG. 2d is a side view of the completed lead on chip packaged device 20. The package size for the die size above described may be on the order of about 400×725 mils and may be thinner than about 50 mils. The external appearance of the package is that of a 24 pin PSOJ.

Figure 2E:
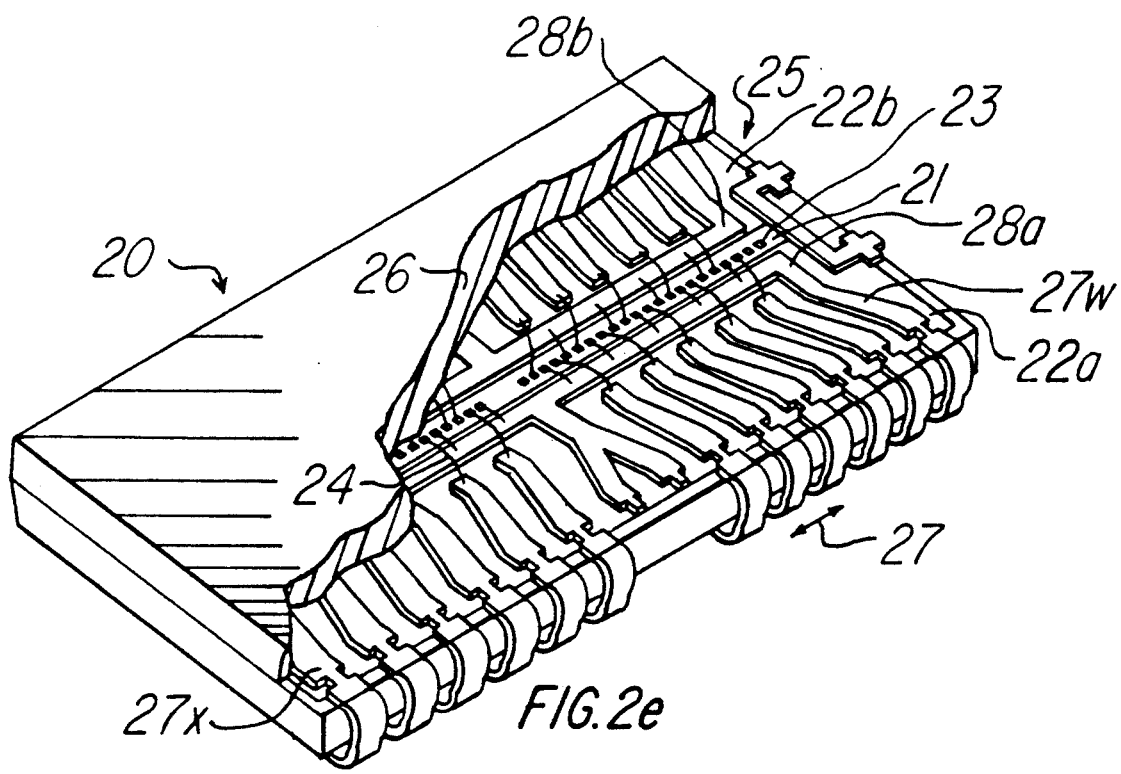
FIG. 2e is a perspective view, partially broken away, of the completed lead on chip center bond integrated circuit package.

FIG. 2e illustrates in perspective a partially cut away view of the finished semiconductor packaged device package 20.

Figure 3:
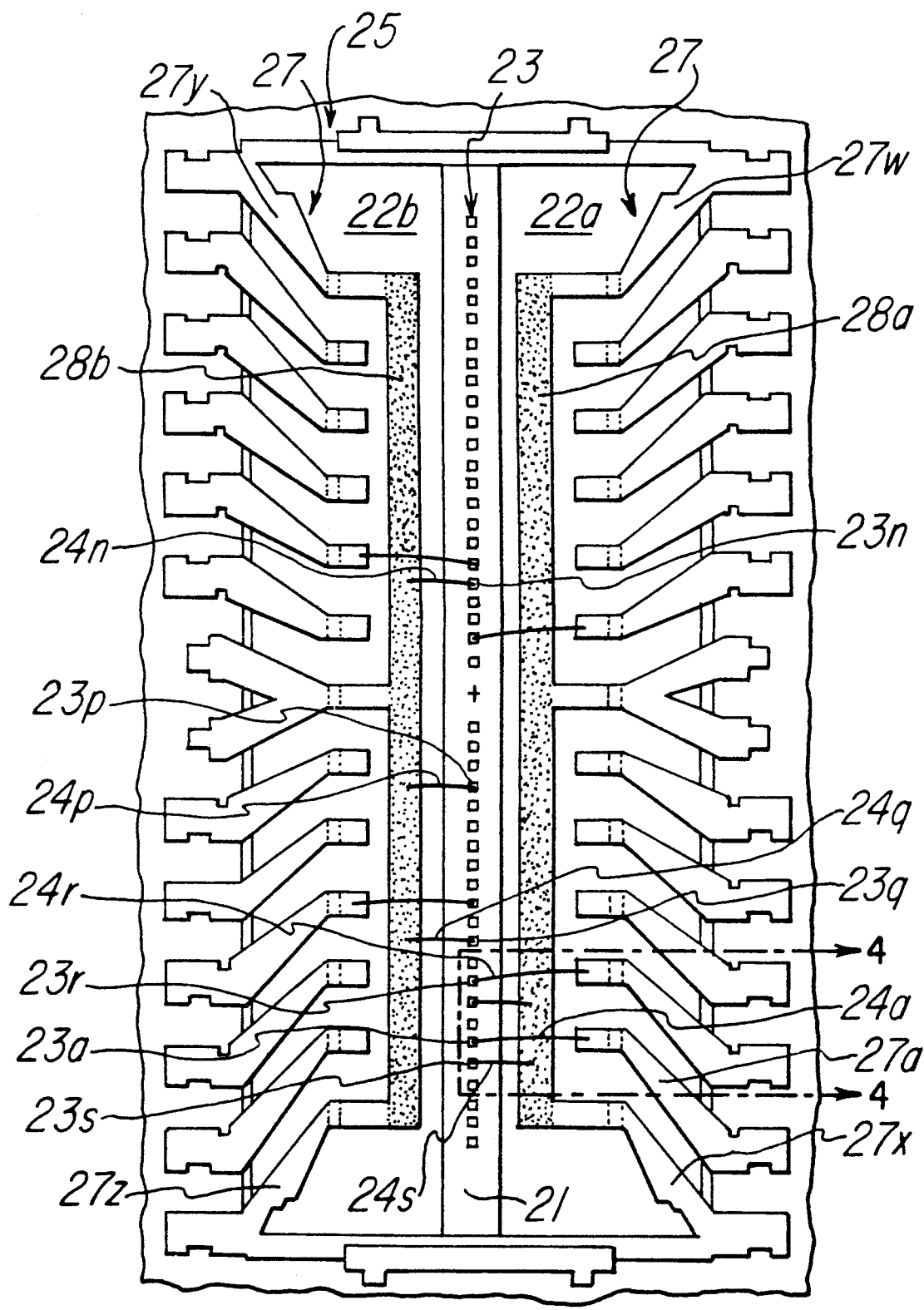
FIG. 3 is partial broken away top view of an altered FIG. 2b, illustrating the preferred embodiment of the invention.
Figure 4:
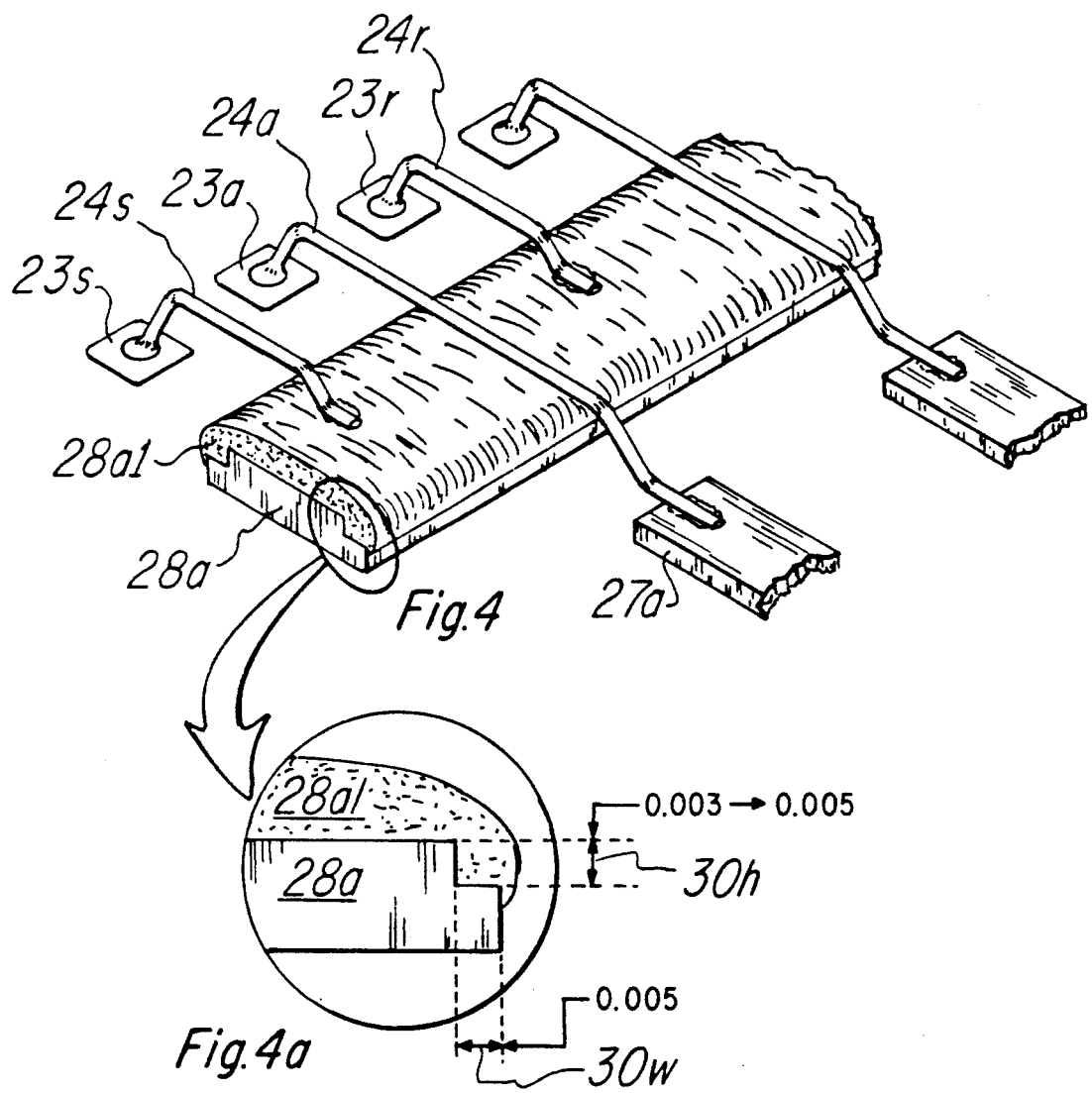
FIG. 4 is a partial perspective view of the preferred embodiment of the invention taken along the line 4—4 of FIG. 3.

FIG. 3 is a partial broken away top view of an altered FIG. 2b illustrating the preferred embodiment of the invention, while FIG. 4 is a perspective view along the line 4—4 of FIG. 3 to further illustrate the preferred embodiment of the invention. (The lead frame 25 is broken away from its outer edges and for clarity, only a few of all the actual wire bonds are illustrated.) FIG. 4a is an enlarged end view of FIG. 4.

Referring now to FIGS. 3, 4, and 4a, the top face of power supply bus 28a is covered with a nonconductive insulating layer 28a1 and the top face of power supply bus 28b is covered with a non conductive insulating layer 28b1. The dielectric coatings 28a1 and 28b1 run the lengths of the power supply busses. The preferred embodiment uses an insulator layer formed from liquid polyimide. Other examples of suitable insulators include rubber, silicone, epoxy, and materials used as stress or alpha-emission buffer coatings on chip surfaces. The liquid polyimide may advantageously be applied on the power supply busses after wire bonding. The liquid coating surrounds the wire bond connections to the power supply busses as it covers the bonding face of the power supply busses. Wire bond 24s extends from bond pad 23s. It passes through dielectric coating 28a1 and connects to power supply bus 28a. Wire bond 24a extends from bond pad 23a. It passes over insulator strips 28a2 and 28a1 nd connects to the internal tip end of lead finger 27a. Wire bond 24q extends from bond pad 23a. It passes through dielectric coating 28b 2 and connects to power supply bus 28b. The insulating layer protects crossing wire bonds from collapsing against the power supply busses and shorting. Should wire bond 24a unfortunately collapse, it should rest against dielectric coating 28a1 and therefore not short to power supply bus 28a.

After curing, the liquid insulator has a curved outer topography. To further decrease to possibility of wire shorting to the power supply busses and to facilitate reception by the power supply busses of the liquid insulator, the power supply busses are preferably notched, or stepped, along the edges before the liquid insulator is applied. This helps the liquid stay on the edge of the power supply busses and not drain or slide off. Referring to FIG. 4a, a step width 30w of approximately 0.005 inches and a step height 30h of approximately 0.003 to 0.005 inches works well. The thickness of the cured liquid insulators should be such to eliminate electrical transmission between a power supply bus and a touching crossing wire bond. A thickness between about 0.002 to 0.006 inches is sufficient.

In the preferred embodiment of the invention described above, the bond wires are connected to the power supply busses before the dielectric coating is applied. This will typically be done by the semiconductor manufacturer at the packaging phase. The liquid dielectric is then applied using well known techniques and is allowed to cure. The cure time and cure temperature are dependent upon the type and thickness of insulator applied; however, a cure temperature between about 150 to 275 degrees centigrade and a cure time between about 30 minutes to 3 hours will be generally be sufficient.

Figure 5:
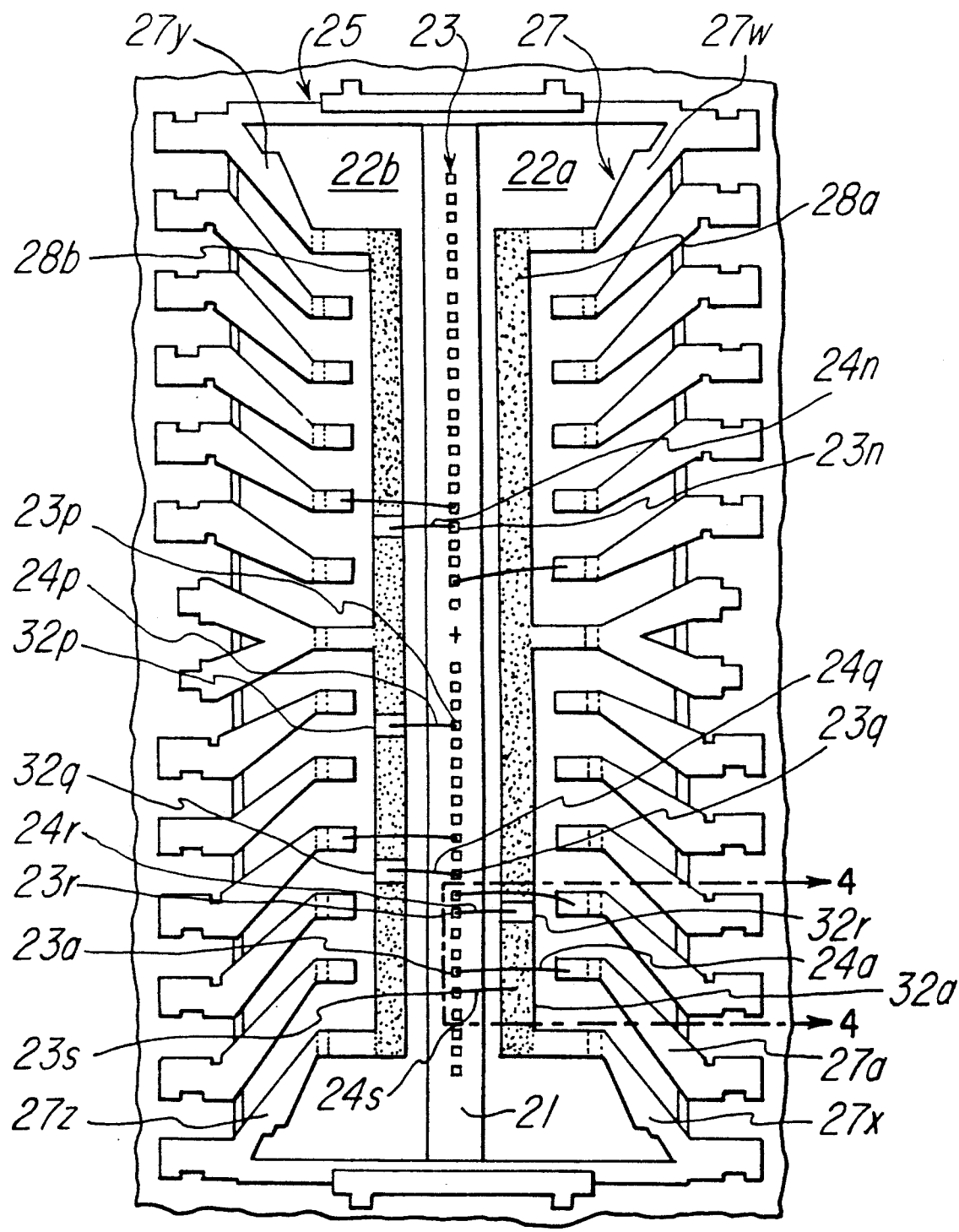
FIG. 5 is partial broken away top view of an altered FIG. 2b, illustrating an alternative embodiment of invention.
Figure 6:
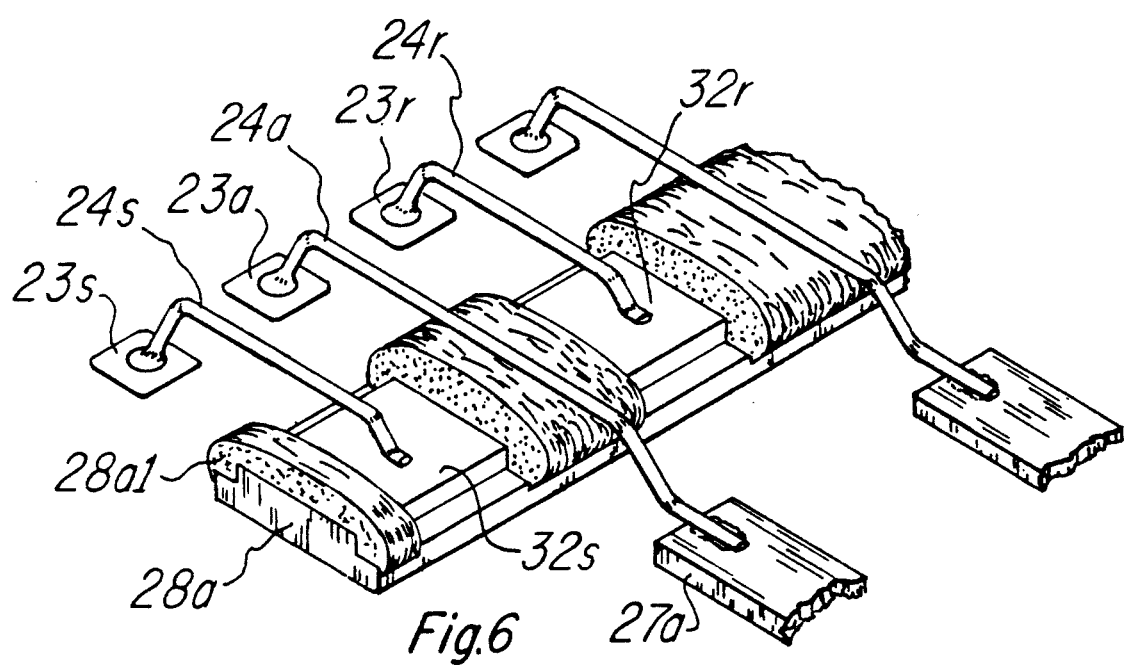
FIG. 6 is an enlarged partial end view of FIG. 5.

FIGS. 5 and 5a illustrate an alternative embodiment of the invention that allows the liquid insulator to be applied by the lead frame manufacturer. Here bond openings 32 on the power supply busses are formed by leaving portions of the power supply busses uncovered by the liquid insulating dielectric. By knowing the lead finger-power supply bus connection scheme, a mask is made corresponding to the wire bond connections to the power supply bus. During application of the nonconductive liquid material, the mask prohibits the liquid dielectric from covering the portions of the power supply busses that the wire bonds will be connected to, thus leaving noninsulated bond openings 32 on the power supply busses. The portions of the power supply busses that the wire bonds will connect to are thus selectively not covered with the liquid insulating dielectric. Wire bond 24s connects to power supply bus 28a through bond opening 32s and wire bond 24a connects to power supply bus 28a through bond opening 32a. Wire bond 24p connects to power supply bus 28b through bond opening 32p. The bond openings should be as small as possible; however, they must be large enough to allow good wire bond connections to the power supply busses. A bond opening having a length of about 0.020 inches is sufficient for the power supply busses that are about 0.015 inches wide.

The insulated lead frame has an insulator, such as a liquid polyimide, that covers the face of the power supply bus. In a semiconductor packaged device wire bonding connecting the power supply busses of a lead frame to the semiconductor die may occur first and the liquid insulator may afterwards be applied to the power supply busses. Alternatively, by knowing the spots on the power supply busses where the wire bonds will touch, the liquid insulator may be applied to the power supply busses before wire bonding occurs. The bonding spots on the power supply busses are not covered with the liquid insulator. Both methods serve to reduce the possibility of shorting between the power supply busses and the crossing wire bonds that connect the lead fingers of the lead frame to the bonding pads of the integrated circuit.

Aside from advantageously reducing the possibility of undesirable wire bond shorting, the liquid insulator also, aids in the creation of very thin integrated circuit packages. The wire height between the power supply busses and the wire bonds that cross over them may be decreased since the possibility of wire bond shorting is reduced. Overall package height may accordingly be reduced.

While this invention has been described with reference to illustrative embodiments, this description is not intended to be construed in a limiting sense. For instance, the invention works well on the chip on lead frame also. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method of making a packaged integrated circuit device comprising:
   A. forming a lead frame in a lead on ship configuration from conductive material to provide a pair of spaced apart parallel conductive busses that extend along the middle of the led frame between lead fingers, the forming including forming a depression along each top lateral margin of each conductive bus;
   B. providing a semiconductor integrated circuit chip with bond pads located centrally along the top surface of the chip to facilitate use with a lead on chip lead frame;
   C. joining together the lead frame and the semiconductor integrated circuit chip;
   D. forming bond wires between the top surfaces of the lead frame and the bond pads of the semiconductor integrated circuit to connect them electrically;
   E. applying liquid insulator to the top surfaces of the conductive busses and any bond wires connected to the conductive busses, the applying including the depressions retaining the liquid insulator substantially on the top surfaces of the conductive busses; and
   F. encapsulating the semiconductor integrated circuit and at least part of the lead frame overlying the semiconductor integrated circuit.

2. The method of claim 1 in which the forming a depression includes forming a step along each top lateral margin of each conductive bus to retain the liquid insulator below the top surface of the conductive busses.

3. The method of claim 1 in which the forming a depression includes forming a sharp edged step along each top lateral margin of each conductive bus to retain the liquid insulator below the top surface of the conductive busses.

4. The method of claim 1 in which the forming a depression includes forming a right-angled step along each top lateral margin of each conductive bus to have a width of 0.005 inch and a height of from 0.003 to 0.005 inch.

* * * * *